United States Patent [19]
Fujiwara

[11] Patent Number: 5,572,177
[45] Date of Patent: Nov. 5, 1996

[54] CURRENT DETECTION UNIT AND RELAY TERMINAL ARRAY

[75] Inventor: Teruhiko Fujiwara, Kyoto, Japan

[73] Assignee: Omron Corporation, Najaokakyo, Japan

[21] Appl. No.: 208,374

[22] Filed: Mar. 10, 1994

[30] Foreign Application Priority Data

Mar. 10, 1993 [JP] Japan .................................. 5-048913

[51] Int. Cl.⁶ .................................................. H01H 67/02
[52] U.S. Cl. .............................. 335/132; 335/18; 335/202
[58] Field of Search ............................. 335/18, 132, 202; 361/42–50

[56] References Cited

U.S. PATENT DOCUMENTS

| 4,496,941 | 1/1985 | Clatworthy . | |
|---|---|---|---|
| 4,802,052 | 1/1989 | Brant et al. ............................. | 335/18 |

FOREIGN PATENT DOCUMENTS

| 1263144 | 11/1989 | Canada . |
|---|---|---|
| 0157054 | 10/1985 | European Pat. Off. . |
| 0538658 | 4/1993 | European Pat. Off. . |
| 2565430 | 12/1985 | France . |
| 9113081 | 12/1991 | Germany . |
| 2219864 | 12/1989 | United Kingdom . |

*Primary Examiner*—Lincoln Donovan
*Attorney, Agent, or Firm*—Fish & Richardson, P.C.

[57] ABSTRACT

A compact current detection unit which detects a failure in a relay terminal and provides a relay terminal array which has a failure detection function and is compact and easy to assemble. The current detection unit includes two symmetrical bobbins; a core located within compartments of bobbins and has an air gap in it; holes in the bobbins which correspond to air gap in the core; coil wound on the compartments; and a circuit board fastened to the side of one of the bobbins on which a Hall element is mounted. A Hall element is inserted through and fixed in position by the holes in the bobbins and the air gap in the core. If a current is flowing through the coil, the lines of magnetic force generated in the core are detected by the Hall element located in the air gap. If no current is flowing, no lines of force are detected.

5 Claims, 7 Drawing Sheets

CURRENT DETECTION UNIT AND RELAY TERMINAL ARRAY

FIELD OF THE INVENTION

This invention relates to a current detection unit and a relay terminal array capable of detecting failures which contains a number of current detection units.

BACKGROUND OF THE INVENTION

There are many types of relay terminals, including relay terminals which are not capable of transmission, relay terminals with transmitting capability, and I/O relay terminals with, for example, photocoupler input and transistor output.

Since none of these existing relay terminals is capable of detecting relay failures (welding of contacts, faulty contacts, and so on) by themselves, faulty relays are slow to be detected. This delay leads to inconvenience, such as down time until a new relay can be installed.

To detect a faulty relay, one could use a logic circuit which has as its inputs the presence or absence of a load current from the relay and an output signal from the relay coil. Based on these inputs, the circuit could judge whether there were a relay fault. With this proposed circuit however, certain problems can occur:

(1) The range of load current which can be detected is limited;
(2) There are limitations on the shape and dimensions of the current sensor;
(3) It is difficult to provide adequate isolation between primary and secondary circuits and among the different poles; and
(4) Such a device cannot be assembled efficiently.

SUMMARY OF THE INVENTION

In light of the problems listed above, this invention has the advantage of providing a relay terminal which is compact and easy to assemble as well as being capable of detecting failures in a compact current detection unit.

The current detection unit of this invention has an annular core with a gap; a case which has a compartment to hold the annular core and a hole which corresponds to the location of the air gap in the annular core contained in the compartment; a circuit board which is mounted on one side of the case and has a magnetic-to-electric converter element on it which is inserted into the air gap of the annular core through the hole in the case; and a coil which is wound on the core compartment of the case.

The relay terminal array of this invention has a housing unit with an open top to hold electronic circuitry; a number of current detection units supported adjacent to each other within the housing unit, each of which has an annular core with a gap; a case which has a compartment to hold the annular core and a hole which corresponds to the location of the air gap in the annular core contained in the compartment, a circuit board which is mounted on one side of the case and has a magnetic-to-electric converter element on it which is inserted into the air gap of the annular core through the hole in the case, and a coil which is wound on the core compartment of the case; and an upper case which has terminals to which one end of each of the coils found on the corresponding current detection unit are connected and terminals to which the other ends are connected. This upper case covers the opening on the top of the housing unit and includes a relay installation containing a number of relays. In summary, the relay terminal array of this invention comprises a housing unit, a number of current detection units, and an upper case.

The current detection unit operates as follows. When a current flows through the coil wound on the core compartment of the case, lines of magnetic force are generated in the core contained in the compartment. These lines of magnetic force are detected by the magnetic-to-electric converter element placed in the air gap in the core. The magnetic field which is detected is converted to an electrical signal and is output as a signal indicating the presence of a current. When there is no current flowing through the coil, no lines of magnetic force are generated in the core. The magnetic-to-electric converter element does not detect a magnetic field, so a signal indicating the absence of a current is output.

This current detection unit has a core in a compartment provided in a case and a coil which is wound on that compartment. A circuit board which has a current detection circuit featuring a magnetic-to-electric converter element is mounted on one side of the case. The case is comprised of two halves which fit together symmetrically, so it can be assembled merely by joining the halves.

If a relay remains on in the relay terminal array when it should be off, because of a failure such as contact welding or faulty contact, a current will continue to flow in the coil in the current detection unit, and the magnetic field generated in the core will be detected by the magnetic-to-electric converter element as described above. If a relay goes off due to a failure when it should be on, no current will flow in the coil, and the magnetic-to-electric converter element will not detect a magnetic field in the core. The output signal from the magnetic-to-electric converter element in these circumstances is used by a logic circuit to determine, based on this signal and the on/off state of the relay, that a relay has failed. This result is transmitted to external circuitry.

In this relay terminal array, the housing unit contains the electronic circuitry as well as a number of the current detection units. The opening on the top of the housing unit is covered by the upper case. Inside the housing unit, a vertical spacer is provided which has vertical partitions between each of at least two current detection units. This provides sufficient isolation of the different poles from one unit to the next, and it prevents external devices from interfering with the current detection units.

The current detection unit of this invention achieves the following advantages:

(1) The current flowing through a circuit flows through a coil so that it can be detected as a magnetic field by a magnetic-to-electric converter element. This scheme insures that the current in the coil will be detected reliably. Since this detection device is built into a relay terminal array, failures of relays can be detected reliably by a logic circuit;
(2) The spatial relationship between the magnetic-to-electric converter element and the core is firmly fixed during assembly;
(3) Sufficient isolation is provided between the primary and secondary elements;
(4) The device can-be assembled efficiently. Since the case is composed of two symmetrical halves, it can be assembled merely by fitting two pieces together, a highly efficient mode of assembly; and
(5) The configuration of this invention allows the unit to be assembled easily and enables it to be made more compact.

The relay terminal array of this invention contains a number of the current detection units and provides the following advantages:

(1) A logic circuit swiftly and reliably detects the failure of a relay based on the presence or absence of a current detected by the current detection unit, and on the on/off status of the relay. This allows a failure to be responded to quickly;

(2) Each current detection unit, and indeed the entire device, is easy to assemble;

(3) Since all components are arranged compactly, the terminal unit itself is compact;

(4) The partitions in the spacer ensure that there is adequate isolation between different poles of adjacent current detection units; and (5) The partitions in the spacer prevent interference from external sources from reaching the current detection units.

DETAILED DESCRIPTION OF THE INVENTION

Figure 1:
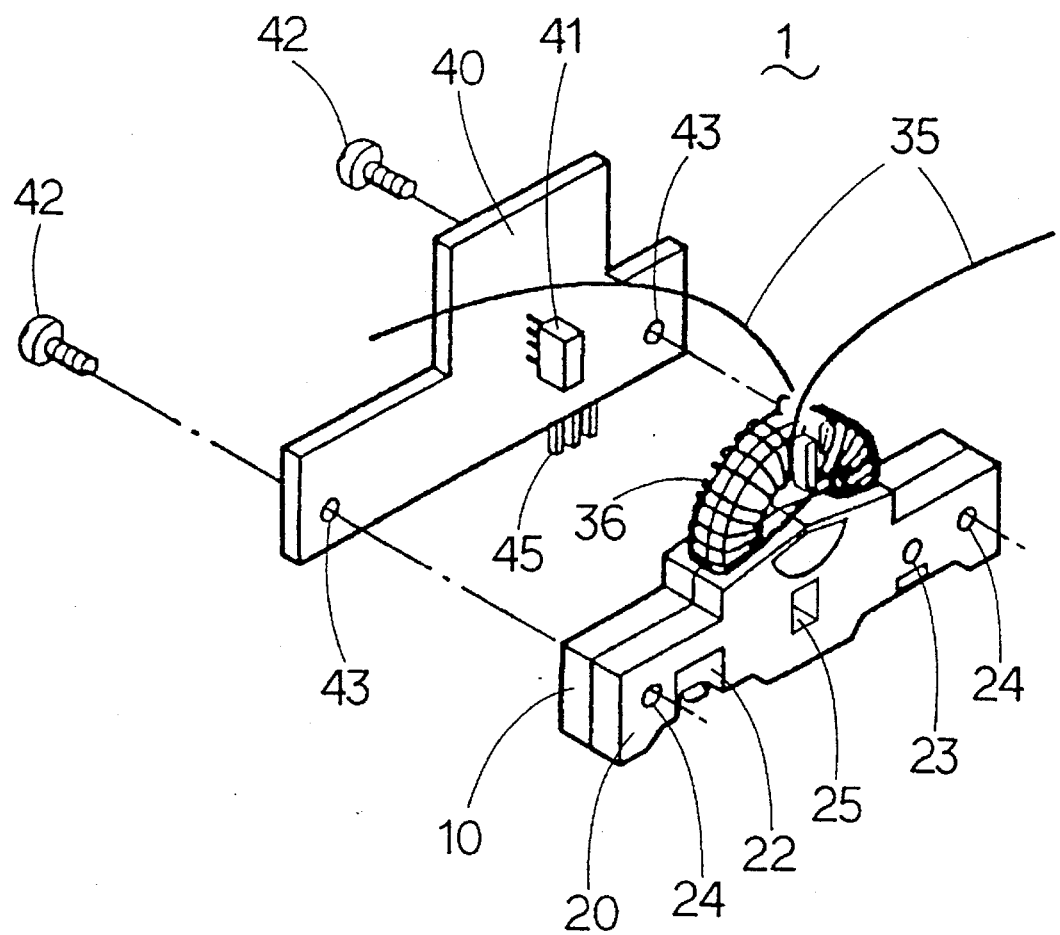
FIG. 1 is a partial exploded perspective view of the current detection unit of this invention.
Figure 2:
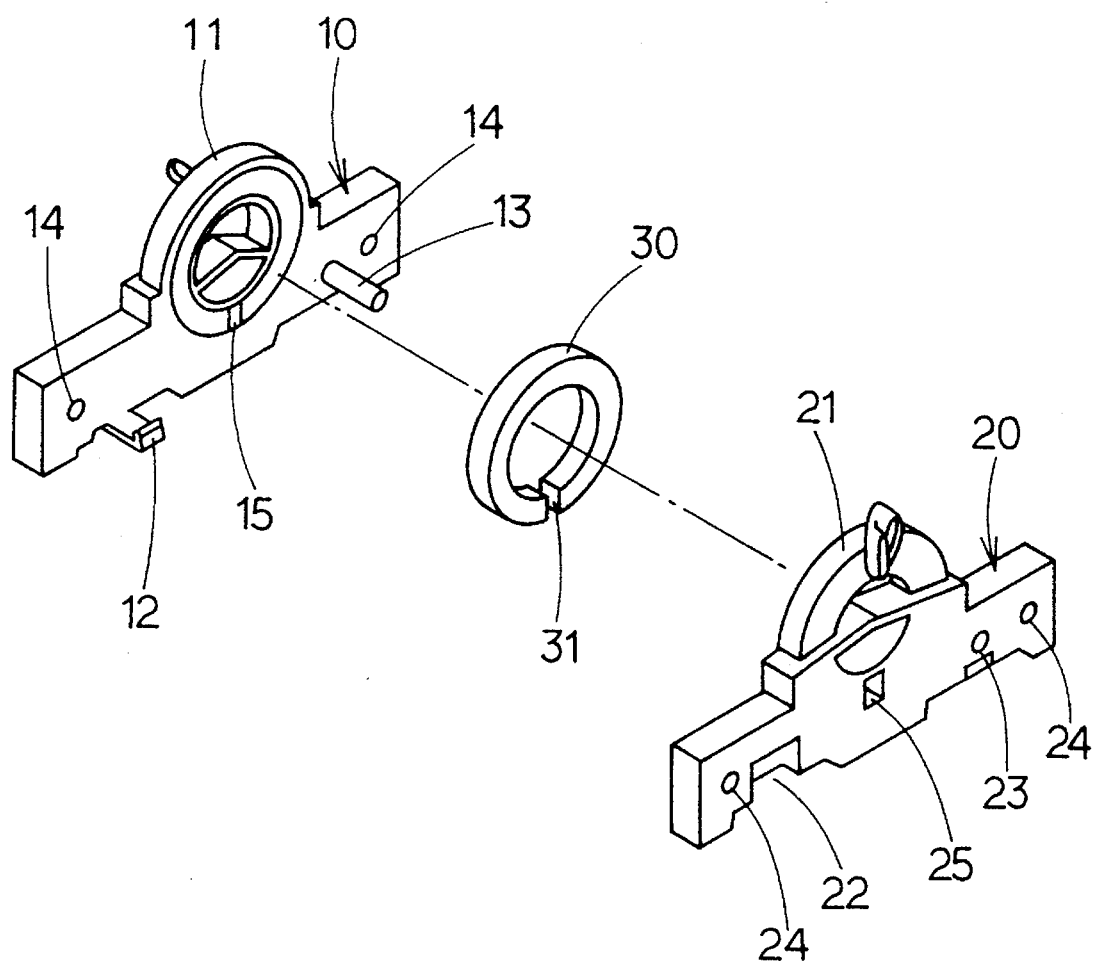
FIG. 2 is a partial exploded perspective view of the current detection unit pictured in FIG. 1.

An example of a current detection unit is shown in exterior oblique view in FIG. 1 and in partial exploded oblique view in FIG. 2. Current detection unit 1 has two bobbins (half cases) 10, 20. Bobbins 10, 20 fit together symmetrically and contain core compartments 11, 21, respectively. Compartments 11, 21 form an annular chamber into which the core is inserted. The top halves of the compartments protrude from bobbins 10, 20. Annular core 30, which is contained in compartments 11, 21, has a partially isolating air gap 31 in it.

The inner side of bobbin 10 has a snap fitting 12 and a boss 13 on it. Bobbin 20 has a depression 22 which corresponds to snap fitting 12 and a hole 23 into which boss 13 fits.

Circuit board 40 is mounted to the outside of bobbin 10 by means of self-tapping screws 42 which are inserted through holes 43 in circuit board 40 and holes 14, 24 in bobbins 10, 20. A single Hall element 41 is mounted on the inside of circuit board 40, the side facing the bobbin. This is the magnetic-to-electric converter element which detects the magnetic field generated in core 30 and converts it to an electrical signal. Since circuit board 40 is mounted on the outer side of bobbin 10, Hall element 41 can pass through hole 15, through air gap 31 in core 30, and partially penetrate hole 25 in bobbin 20. This configuration allows Hall element 41 to detect with certainty the lines of magnetic force generated in core 30. On the front of circuit board 40 is the current detection circuit, which comprises various electronic components. In the relay terminal array, circuit board 40 is connected to another circuit board 80 (see FIG. 6) through connectors 45.

Magnet wire 35 is wound a predetermined number of turns on compartments 11, 21 of bobbins 10, 20 to produce coil 36. In one aspect of the invention, coil 36 is wound starting from the top and ending at the top, so that both halves are wound in the same direction.

In a current detection unit 1 configured in this way, core 30 is enclosed in compartments 11, 21 of bobbins 10, 20. When bobbins 10, 20 are joined, snap fitting 12 on bobbin 10 engages with depression 22 on bobbin 20 and boss 13 on bobbin 10 goes into hole 23 in bobbin 20. In this way bobbins 10, 20 are formed into an integral unit. Circuit board 40 is mounted on the side of bobbin 10. When coil 36 is wound and placed in compartments 11, 21, the assembly is complete.

In the configuration described above, Hall element 41 is easily and reliably positioned in air gap 31 of core 30 at the time of assembly. This insures that the spatial relationship between Hall element 41 and core 30 will remain fixed. It also guarantees a sufficient isolation distance between the primary and secondary circuits and improves the efficiency of the entire assembly process.

The operation of current detection unit 1 is described below. When a current flows through coil 36, lines of magnetic force are generated in core 30 inside compartments 11, 21. These lines of magnetic force are detected by Hall element 41 in air gap 31 and converted to an electrical signal. A signal indicating the presence of a current is output by the current detection circuit. When there is no current flowing through coil 36, no magnetic field is generated in core 30. Hall element 41 does not detect a magnetic field, and a signal indicating the absence of a current is output.

Figure 3:
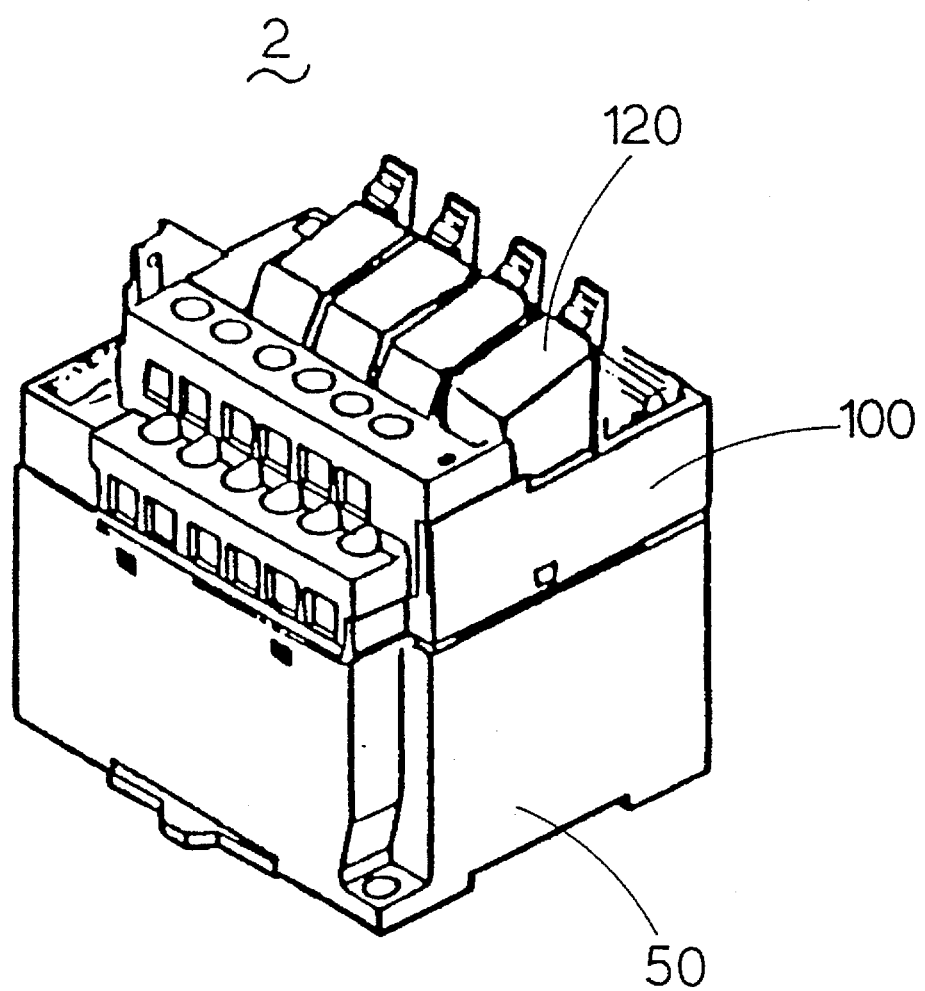
FIG. 3 is a perspective view of the exterior of the relay terminal array of this invention.

The relay terminal array which contains current detection units 1 described above will now be explained. A perspective view of the exterior of a preferred embodiment of this relay terminal array is shown in FIG. 3. Exploded perspective views showing components are provided in FIGS. 4–7. Relay terminal array 2 comprises housing unit 50, which is open on top, and upper case 100, containing a number of relays 120 (in this case, four), which is mounted on the top of housing unit 50 so that it can be put on and taken off.

Figure 4:
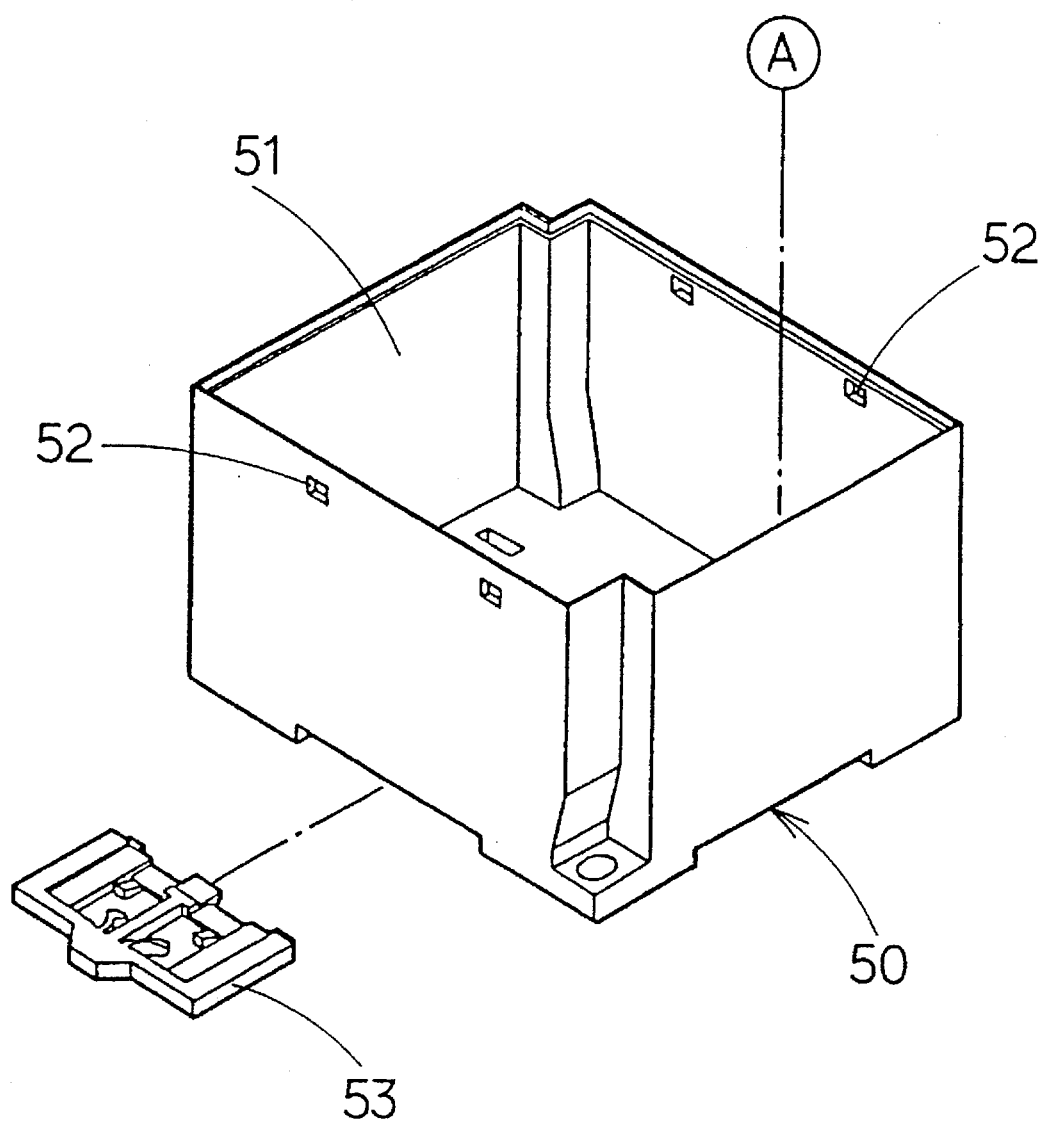
FIG. 4 is a perspective view of the exterior of the housing unit on the relay terminal array pictured in FIG. 3.

As shown in FIG. 4, housing unit 50 has four holes 52 close to its open top 51. By means of tabs 101 on upper case 100 (see FIG. 7) which engage in holes 52, the upper case is mounted on housing unit 50 so that it can easily be removed and put back on. Fixture rail 53 engages with the bottom of housing unit 50.

Figure 7:
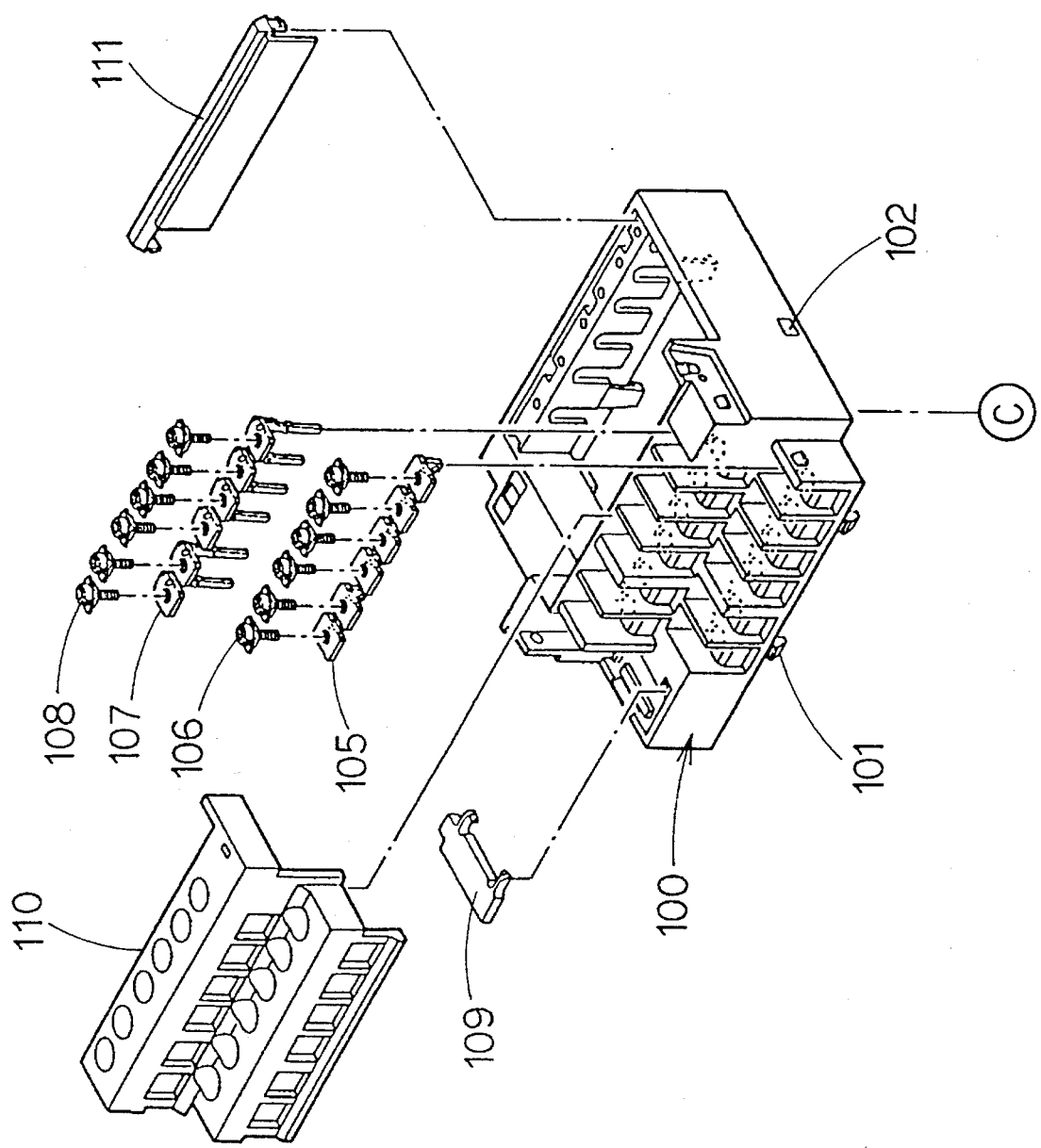
FIG. 7 is a partial exploded perspective view focusing on the upper case in the relay terminal array pictured in FIG. 3.

As can be seen in FIG. 7, six terminals 105 are attached to upper case 100 by screws 106, and six terminals 106 are attached by screws 108. Cover 109 is mounted over antistatic plate 93 (see FIG. 5) which discharges the static electricity from circuit board 90, which is exposed on the top of upper case 100. Cover 110 is mounted over the portion of the relay terminal array where terminals 105, 107 are mounted and so that it is removable. Cover 111 is installed on top of LEDs 94 (see FIG. 5), which are mounted on circuit board 90.

Figure 5:
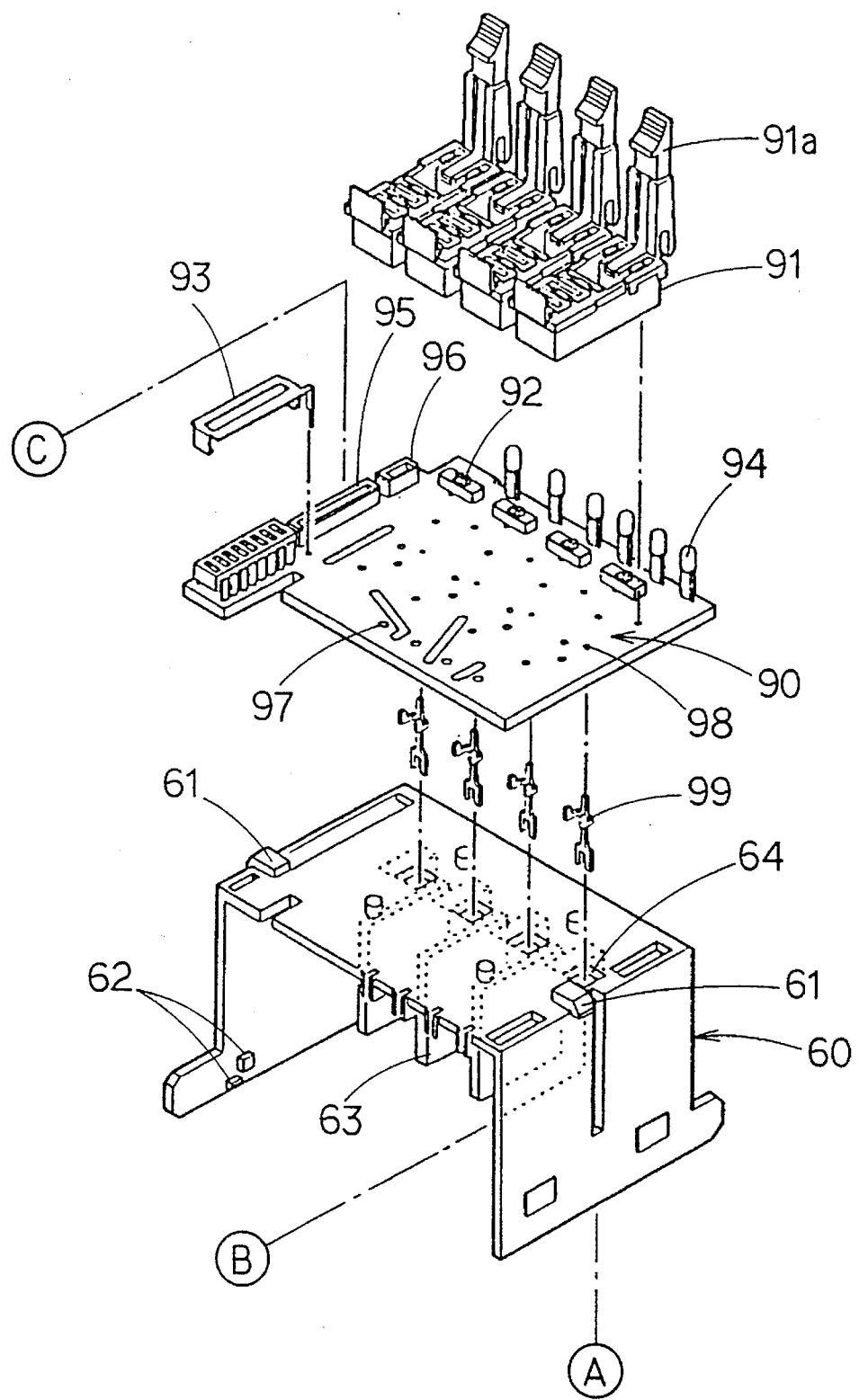
FIG. 5 is a partial exploded perspective view focusing on the spacers in the relay terminal array pictured in FIG. 3.

Inside housing unit 50 is a spacer 60, which is shaped as shown in FIG. 5. On the top surface of spacer 60 are snap fittings 61, which engage with holes 102 in upper case 100 (see FIG. 7) to secure spacer 60 to the upper case.

Figure 6:
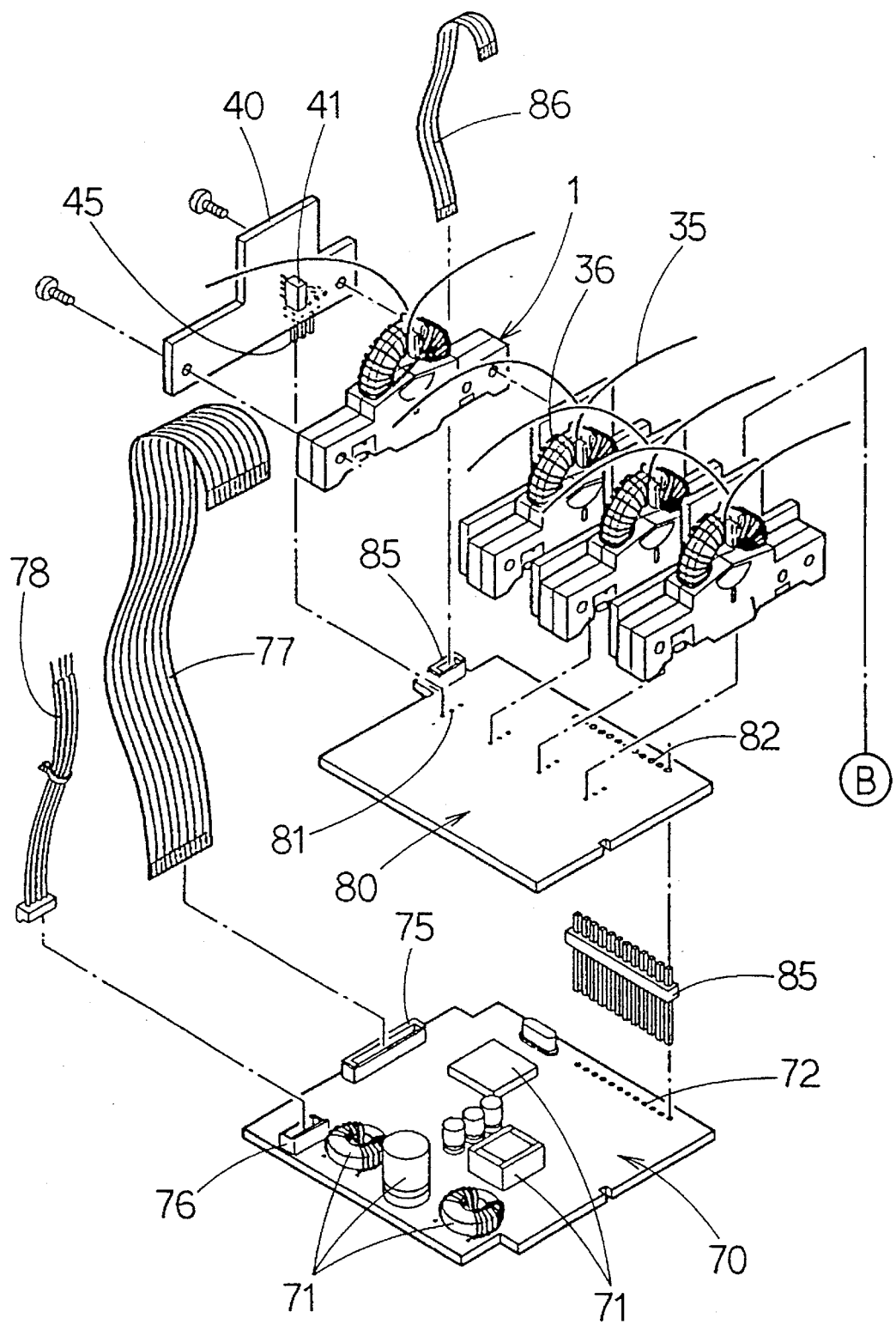
FIG. 6 is a partial exploded perspective view focusing on the current detection units in the relay terminal array pictured in FIG. 3.

In FIG. 6 one can see that inside spacer 60 there are a number (in this case, four) of the current detection units 1 arranged one next to the other. The tops of circuit boards 40 in these current detection units 1 engage in guide grooves (not shown) in spacer 60 so that the units are supported vertically in fixed positions with respect to the spacer. As shown in FIG. 5, spacer 60 has three isolation barriers (partitions) 63, which extend vertically from the top of the spacer. Each of these isolation barriers 63 extends between two detection units 1. Barriers 63 insure that there is an adequate isolation distance between the different poles of neighboring detection units 1.

Connectors 45 on circuit board 40 of each detection unit 1 are inserted into holes 81 in circuit board 80 and soldered. The output circuit, which is composed of various electronic components, is built on circuit board 80. The ends of circuit board 80 go between paired tooth-shaped positioning guides which are furnished in three places on spacer 60 to keep the board in the correct position on the spacer.

Circuit board 80 is connected to circuit board 70 by means of connectors 85, which are inserted through holes 82 on board 80 and holes 72 on board 70 and soldered in place. Circuit board 70 has a number of circuits on it, including a power supply circuit, a reset circuit, a driver/receiver circuit(s) and a control circuit(s) for transmitting. These circuits are comprised of electronic components 71. The ends of circuit board 70 fit between paired tooth-shaped positioning guides which are furnished in four places on spacer 60 (see FIG. 5) to keep the board in the correct position on the spacer.

As shown in FIG. 5, there is another circuit board 90 on top of spacer 60. Circuit board 90 is supported by guides (not shown) on upper case 100 and by terminals 107, which are inserted into holes 97 in circuit board 90 and then soldered. Relays 120 (see FIG. 3) on circuit board 90 comprise four relay sockets 91 (the relay installation), which are mounted to be removable; four opening detection switches 92; discharge plate 93 for static electricity; and six LEDs 94. An output circuit is also mounted on circuit board 90. By operating levers 91a of relay sockets 91, one can release relays 120 from their mountings on sockets 91.

There are four terminals 99 (the connection terminals for the relays), each of which has one of its ends inserted through a hole 98 in circuit board 90. The other end goes through one of rectangular holes 64 in spacer 60 and protrudes into the interior of the spacer. One end of the coil 36 in each current detection unit 1 is soldered to the end of each terminal 99 which protrudes from circuit board 90. The other end of each coil 36 is soldered to one of four terminals 105.

As shown in FIGS. 5 and 6, circuit boards 70 and 90 are connected to each other through connector 75 on board 70 and flat cable 77 which is mounted onto connector 95 on board 90. Circuit boards 80 and 90 are connected to each other through connector 85 on board 80 and flat cable 86, which is mounted onto connector 96 on board 90. To connect an external power source or transmission circuitry, harness 78, which is joined to connector 76 on circuit board 70, is soldered to two of terminals 105 and two of terminals 107.

A relay terminal array 2 constructed in this fashion will automatically detect a failure of one of relays 120 and transmit to the external circuitry a signal indicating the detection of this failure. When a failure, such as contact welding or a faulty contact, occurs in one of relays 120 which are mounted on relay sockets 91, the current detection units 1 will transmit a signal indicating the presence or absence of a current to a logic circuit. Based on this signal and the on/off status of relays 120, the logic circuit will determine whether a failure has occurred. If, for example, current detection unit 1 detects a current when a relay 120 is in the off state, or if it does not detect a current when the relay is in the on state, the logic circuit will produce a judgment that a failure has occurred. This function allows failures to be reported swiftly so that countermeasures can be taken promptly to eliminate down time.

What is claimed is:

1. A current detection unit, comprising:

an annular core having an air gap;

a case having a compartment in which said annular core is disposed, and a hole in said case disposed in a position corresponding to said air gap in said annular core;

a circuit board mounted on one side of said case, said circuit board having a magnetic-to-electric converter element disposed thereon, said magnetic-to-electric converter being inserted into said air gap of said annular core through said hole in said case; and a coil wound on said annular core.

2. A current detection unit as claimed in claim 1, wherein said case is comprised of two halves which fit together symmetrically.

3. A current detection unit as claimed in claim 2, wherein said case halves are identical.

4. A relay terminal array, comprising:

a housing unit having an open top which has space to contain electronic circuitry;

a plurality of current detection units positioned adjacent to each other in said housing unit, each of said current detection units comprising:

an annular core having an air gap, a case having a compartment in which said annular core is disposed, and a hole in said case disposed in a position corresponding to said air gap in said annular core, a circuit board mounted on one side of said case, said circuit board having a magnetic-to-electric converter element disposed thereon, said magnetic-to-electric converter inserted into said air gap of said annular core through said hole in said case, and a coil wound on said annular core; and an upper case mounted on said housing unit, comprising:

a plurality of relay sockets and a plurality of terminals connected to said relay sockets, each of said relay sockets and terminals connected thereto corresponding to one of said current detection units, wherein each of said coils is connected in series with an output side of its corresponding relay socket.

5. A relay terminal array as claimed in claim 4, wherein said housing unit has a plurality of vertical spacers along the walls inside said housing unit to separate said current detection units from each other.

* * * * *